(12) United States Patent
Vakilimoghaddam et al.

(10) Patent No.: US 12,250,795 B2
(45) Date of Patent: Mar. 11, 2025

(54) SYSTEMS FOR A HEAT EXCHANGER

(71) Applicant: Dana Canada Corporation, Oakville (CA)

(72) Inventors: Farbod Vakilimoghaddam, Oakville (CA); Silvio Tonellato, Hamilton (CA); Benjamin A. Kenney, Toronto (CA)

(73) Assignee: DANA CANADA CORPORATION, Oakville (CA)

( * ) Notice: Subject to any disclaimer, the term of this patent is extended or adjusted under 35 U.S.C. 154(b) by 219 days.

(21) Appl. No.: 17/651,545

(22) Filed: Feb. 17, 2022

(65) Prior Publication Data

US 2023/0262947 A1    Aug. 17, 2023

(51) Int. Cl.
*H05K 7/20* (2006.01)
*H01L 23/473* (2006.01)

(52) U.S. Cl.
CPC ..... *H05K 7/20936* (2013.01); *H01L 23/4735* (2013.01); *H05K 7/20263* (2013.01); *H01L 2924/0002* (2013.01)

(58) Field of Classification Search
CPC ........... H05K 7/20936; H05K 7/20263; H05K 7/20254; H05K 7/20; H01L 23/4735; H01L 2924/0002; H01L 23/367; H01L 23/4336; F28D 15/00; F28F 3/00; F28F 27/02
USPC ........................................................ 165/80.4
See application file for complete search history.

(56) References Cited

U.S. PATENT DOCUMENTS

| | | | |
|---|---|---|---|
| 6,104,610 A * | 8/2000 | Tilton | H01L 23/4735 174/547 |
| 7,035,104 B2 | 4/2006 | Meyer | |
| RE40,618 E | 1/2009 | Nelson et al. | |
| 7,940,527 B2 | 5/2011 | Krause | |
| 9,131,631 B2 | 9/2015 | Joshi | |
| 9,867,319 B2 * | 1/2018 | Lei | H02M 7/003 |
| 10,028,410 B2 | 7/2018 | Parida | |
| 10,306,802 B1 * | 5/2019 | Ditri | H01L 23/4735 |
| 11,470,748 B1 * | 10/2022 | Inam | H05K 7/20272 |
| 2009/0032937 A1 * | 2/2009 | Mann | H01L 23/4735 165/80.4 |
| 2010/0033932 A1 * | 2/2010 | Thome | H05K 7/20927 361/699 |
| 2010/0091457 A1 * | 4/2010 | Krause | H01L 23/473 361/689 |

(Continued)

FOREIGN PATENT DOCUMENTS

| | | | | |
|---|---|---|---|---|
| GB | 2197450 A * | 5/1988 | | F28D 9/0031 |
| WO | 2005117108 A1 | 12/2005 | | |

*Primary Examiner* — Len Tran
*Assistant Examiner* — Gustavo A Hincapie Serna
(74) *Attorney, Agent, or Firm* — McCoy Russell LLP

(57) ABSTRACT

Systems are provided for a heat exchanger assembly. In one example the system may include a top plate, a fluid inlet and a fluid outlet, a bottom plate coupled to the top plate, a perforated plate positioned between the top plate and the bottom plate having an underside facing the bottom plate and including perforations shaped to generate an impingement jet onto the bottom plate, and at least one of the following: the top plate comprising a portion being inclined with respect to a longitudinal axis of the heat exchanger assembly; the perforated plate being inclined with respect to the longitudinal axis or a lateral axis of the heat exchanger assembly; and the heat exchanger assembly further comprising a flow control plate.

19 Claims, 7 Drawing Sheets

(56) References Cited

U.S. PATENT DOCUMENTS

| | | | |
|---|---|---|---|
| 2011/0141690 A1* | 6/2011 | Le | H01L 23/4735 |
| | | | 361/689 |
| 2013/0314870 A1* | 11/2013 | Kwak | H05K 7/20927 |
| | | | 361/689 |
| 2014/0347817 A1* | 11/2014 | Joshi | H05K 7/20927 |
| | | | 361/699 |
| 2016/0209078 A1* | 7/2016 | Giannoulis | F24H 3/0405 |
| 2016/0365301 A1* | 12/2016 | Takano | H01L 23/4735 |
| 2017/0092565 A1* | 3/2017 | Chen | H05K 7/20281 |
| 2018/0142968 A1* | 5/2018 | Deguchi | F28F 13/12 |
| 2019/0013258 A1* | 1/2019 | Malouin, Jr. | F28D 1/0246 |
| 2020/0011620 A1* | 1/2020 | Sherrer | H01L 23/4735 |
| 2020/0051895 A1* | 2/2020 | Ganti | H01L 23/433 |
| 2020/0227341 A1* | 7/2020 | Neal | F28F 3/12 |
| 2021/0159148 A1* | 5/2021 | Egger | H05K 7/20927 |
| 2022/0178626 A1* | 6/2022 | Aghababaie | B29C 64/129 |
| 2023/0010253 A1* | 1/2023 | Balachandar | H05K 7/2039 |
| 2023/0050543 A1* | 2/2023 | Huck | B60L 50/51 |

* cited by examiner

SYSTEMS FOR A HEAT EXCHANGER

TECHNICAL FIELD

The present description relates generally to systems for thermal management of electronics.

BACKGROUND AND SUMMARY

Heat generating devices, such as electronics, may be coupled to a heat exchanger to remove heat and lower the maximum operating temperature of the heat generating device. In some examples, fluid such as coolant may be used to receive heat generated by the electronic device via convective thermal transfer, and to remove such heat from the electronic device.

In some examples, turbulizers are used in heat exchangers to enhance heat transfer. Commonly, turbulizers include metal or other material elements having an undulated or convoluted shape to create turbulence in the coolant fluid flow and in this way increase heat transfer in the heat exchanger. While turbulizers increase heat transfer, a difficulty with turbulizers is that they may also increase pressure drop inside the heat exchanger limiting coolant flow in some applications.

Jet impingement of a liquid or gas onto the surface of heat transfer may be used to increase heat transfer capacity and reduce pressure drop of a heat exchanger. For example, jet impingement may be used to cool an electronic device by directing jets of coolant fluid onto a target surface that is thermally coupled to the device. In some examples, the orientation of heat exchange fluid channels and impingement jets may affect coolant fluid distribution and heat transfer performance. Moreover, without flexibility in impingement jet configuration, target surface contact may be limited and the heat transfer capacity of the heat exchanger reduced.

In one example, the issues described above may be addressed by a heat exchanger assembly, comprising: a top plate; a fluid inlet and a fluid outlet; a bottom plate coupled to the top plate; a perforated plate positioned between the top plate and the bottom plate having an underside facing the bottom plate and including perforations shaped to generate an impingement jet onto the bottom plate, and at least one of the following: the top plate comprising a portion being inclined with respect to a longitudinal axis of the heat exchanger assembly; the perforated plate being inclined with respect to the longitudinal axis or a lateral axis of the heat exchanger assembly; and the heat exchanger assembly further comprising a flow control plate. In this way, pressure drop of coolant fluid is reduced and surface contact of impingement jets is increased.

In one embodiment, the perforated plate may include guide ribs positioned on a side of the perforated plate and the guide ribs may be inclined with respect to both the lateral axis and the longitudinal axis of the heat exchanger assembly. In one example, the perforated plate may be substantially flat, meaning that it would be understood to be flat by a person skilled in the art without being perfectly flat. The heat exchanger assembly may include various configurations. In one embodiment, the top plate may include a portion being inclined with respect to a longitudinal axis of the assembly and the perforated plate may be substantially parallel to the bottom plate. In some embodiments, the perforated plate may be angled and/or inclined to promote coolant flow and the top plate and the bottom plate may be substantially parallel. In one embodiment, the heat exchanger assembly may be configured with the perforated plate inclined with respect to the longitudinal axis of the assembly and substantially parallel top and bottom plates. In an additional or alternative embodiment, the heat exchanger may be configured with a first and a second perforated plate, and the first and second perforated plates inclined with respect to a longitudinal axis of the assembly, and substantially parallel top and bottom plates. In another embodiment, the heat exchanger assembly may be configured with a perforated plate including two portions being symmetrical along the longitudinal axis of the assembly and the two portions of the plate may be inclined with respect to the lateral axis of the assembly, and substantially parallel top and bottom plates. Embodiments including substantially parallel top plate and the bottom plate may enable stacked configurations including of two or more heat exchanger assemblies. In one embodiment, the heat exchanger assembly may include a second perforated plate, wherein the perforated plate and the second perforated plate are mirror oriented to generate impingement jets on an upper plate and a lower plate of the assembly. In another embodiment, the perforated plate may include a flow control plate positioned above the perforated plate for adjusting an amount or position of coolant to pass through impingement jets. In one example, the top plate, bottom plate, and perforated plate of the heat exchanger may be rectangular. In one example the height of the heat exchanger assembly may be less than a lateral width and the lateral width less than a longitudinal length. In one example, the heat exchanger assembly may include an electronic module adjacent a bottom of the bottom plate. In this way, jet impingement, fluid channel angling, and perforated plate orientation may direct coolant flow while reducing overall pressure drop to increase heat transfer capacity of a heat exchanger assembly.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

DETAILED DESCRIPTION

Figure 1A:
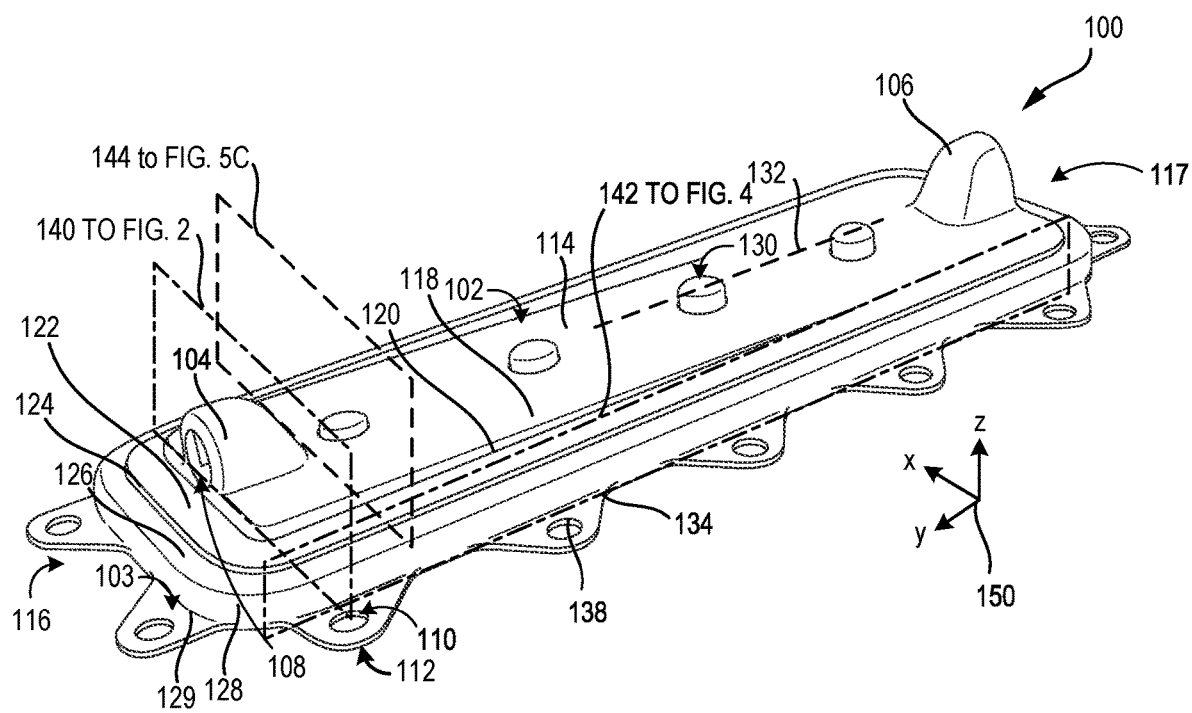
FIG. 1A shows a top view of a heat exchanger assembly.
Figure 1B:
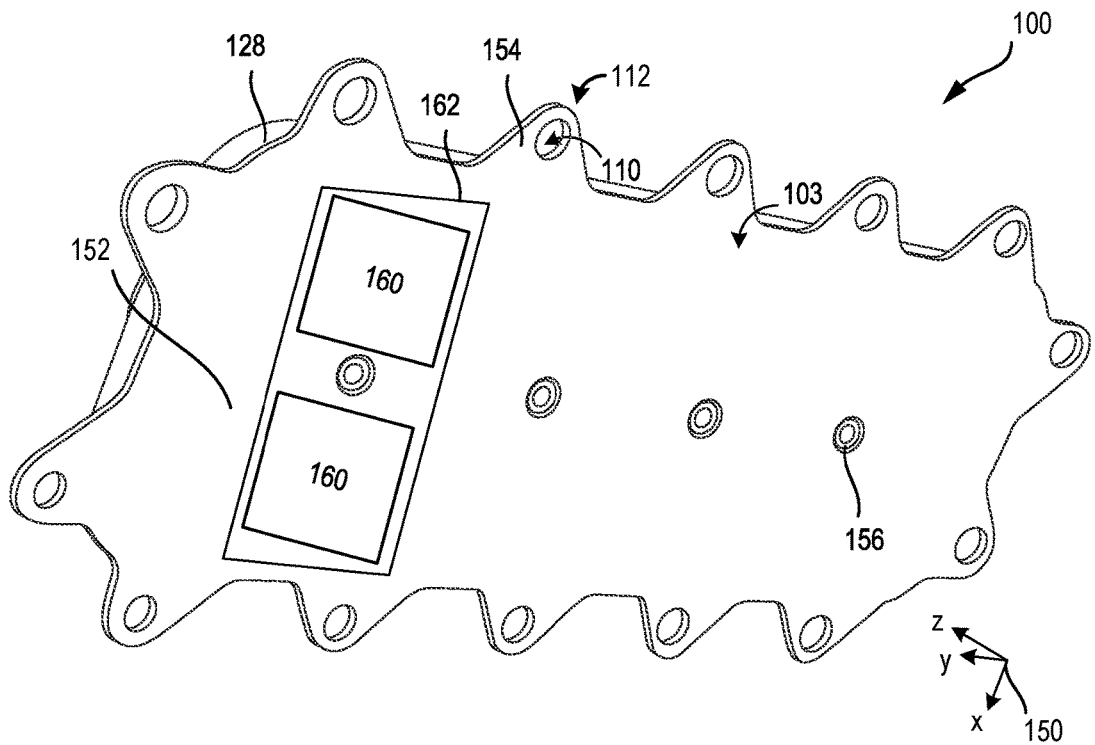
FIG. 1B shows a bottom view of the heat exchanger assembly.
Figure 2:
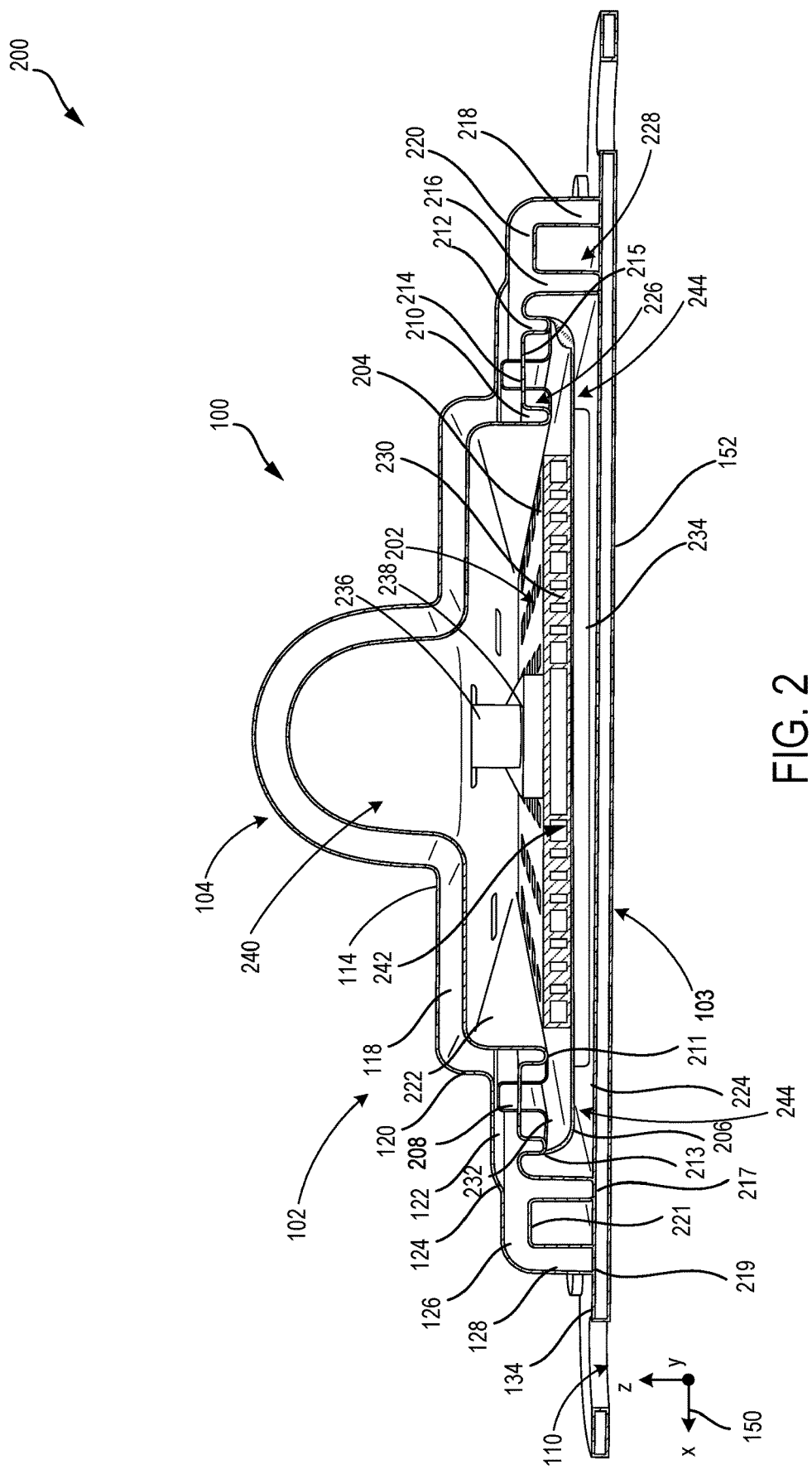
FIG. 2 shows a cross section of the heat exchanger assembly.
Figure 3A:
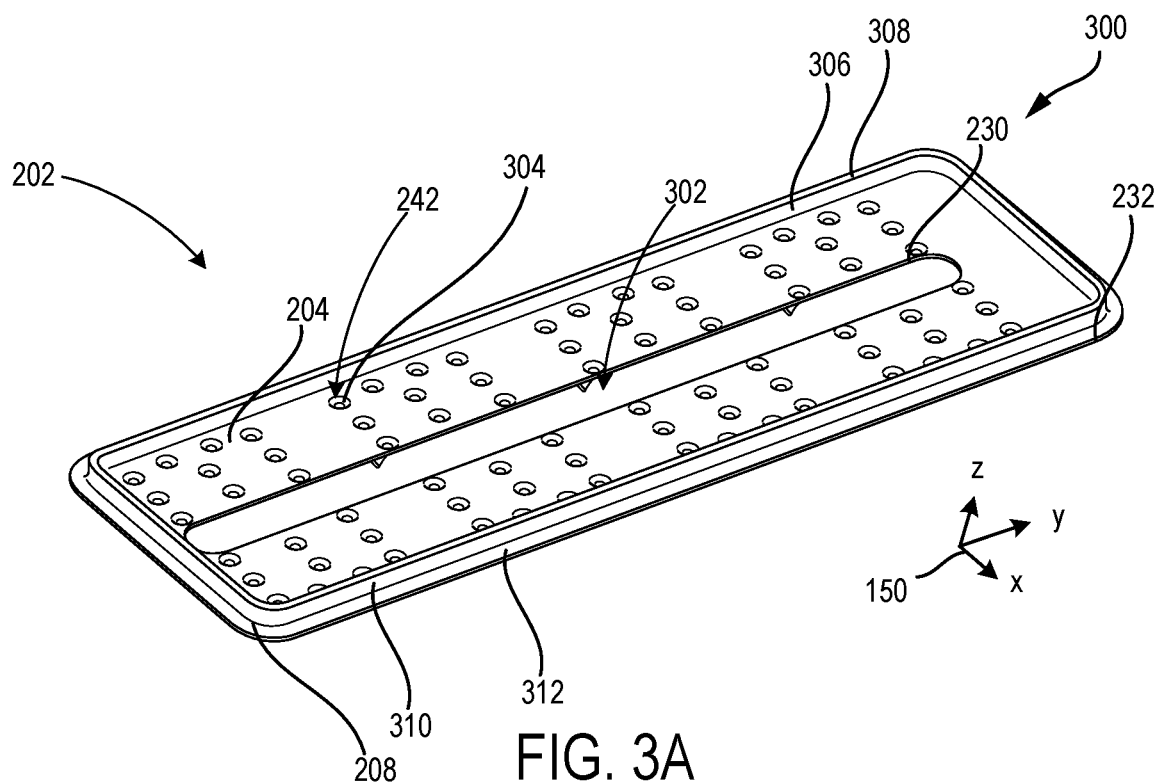
FIG. 3A shows a top view of a perforated plate for the heat exchanger assembly.
Figure 3B:
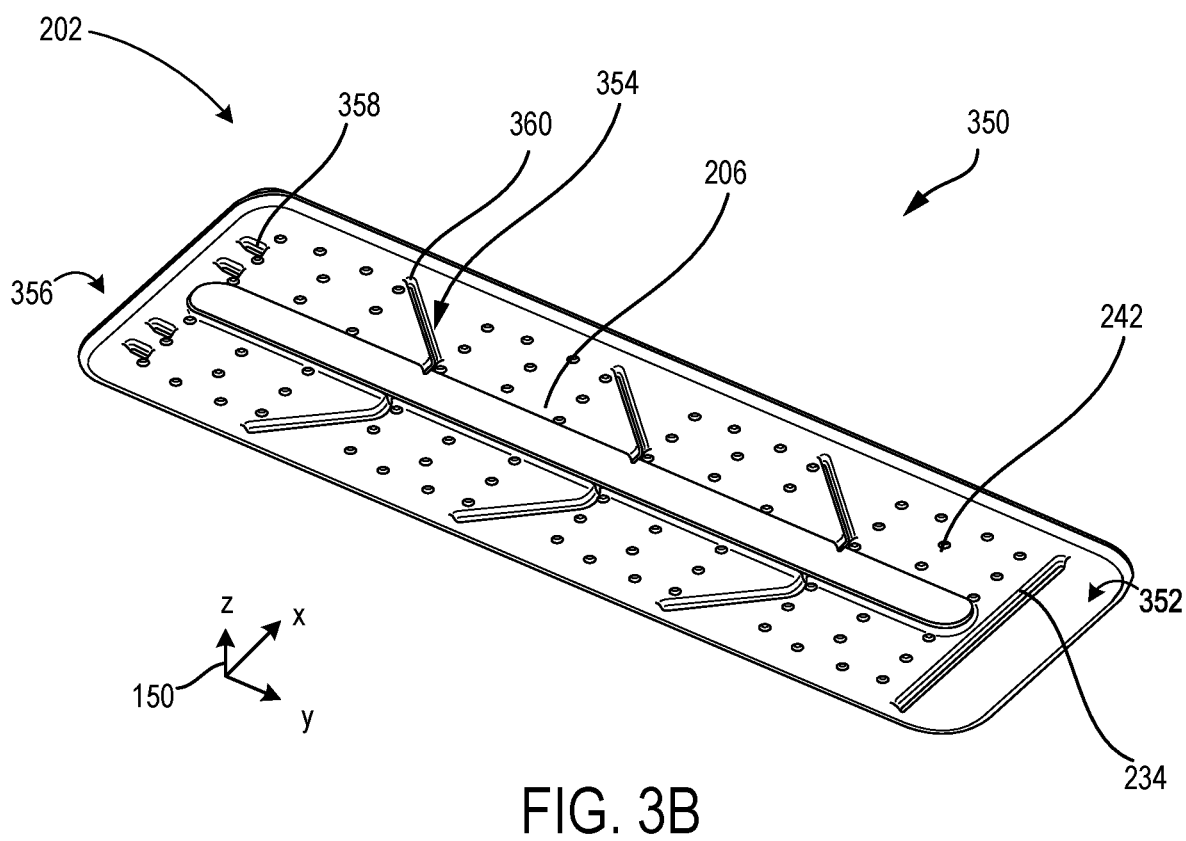
FIG. 3B shows a bottom view of the perforated plate for the heat exchanger assembly.
Figure 4:
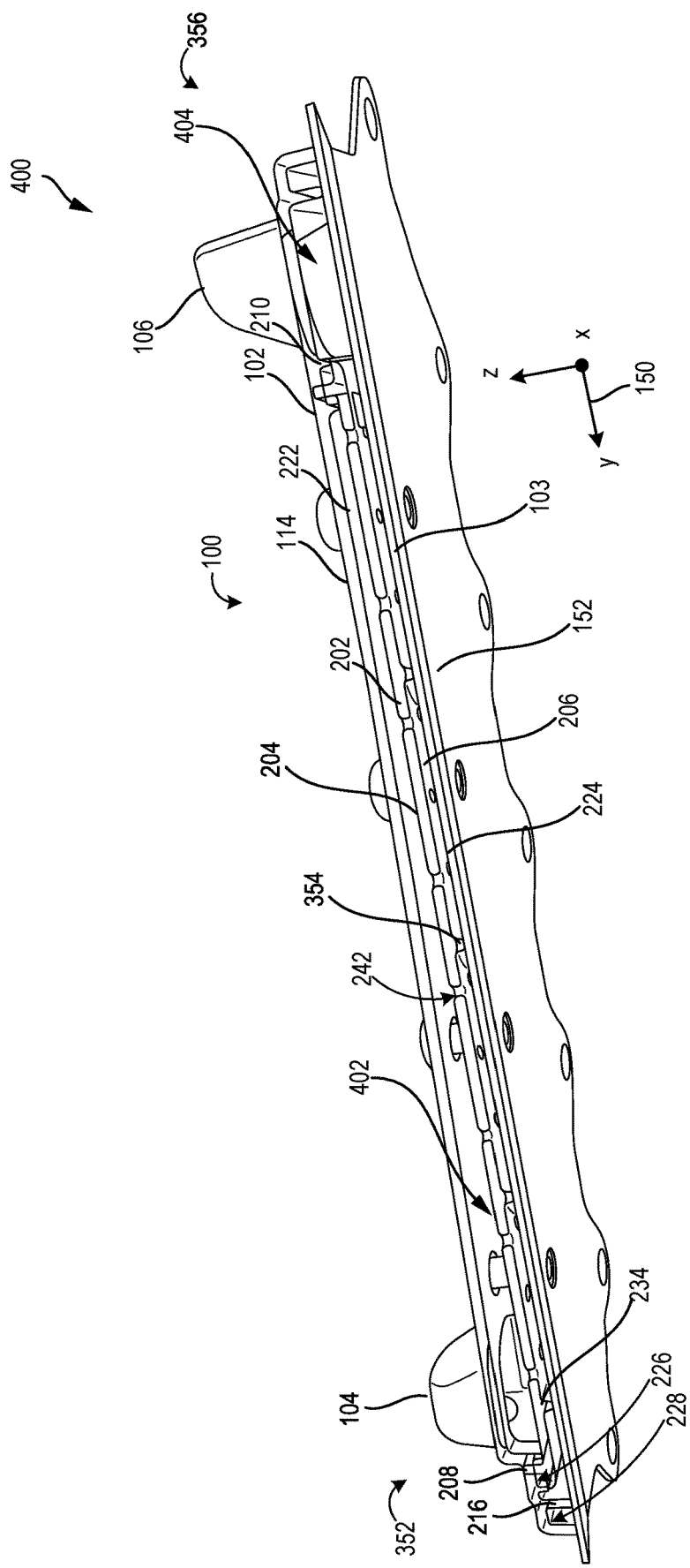
FIG. 4 shows a section of a first embodiment for the heat exchanger assembly, particularly a fluid channel profile.
Figure 5A:
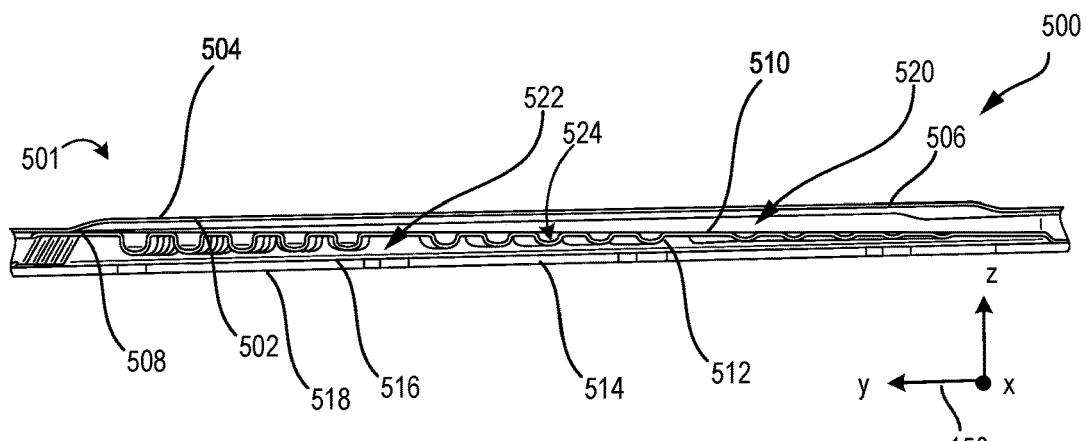
FIG. 5A shows a section of a second embodiment for a heat exchanger assembly, particularly the fluid channel profile.
Figure 5B:
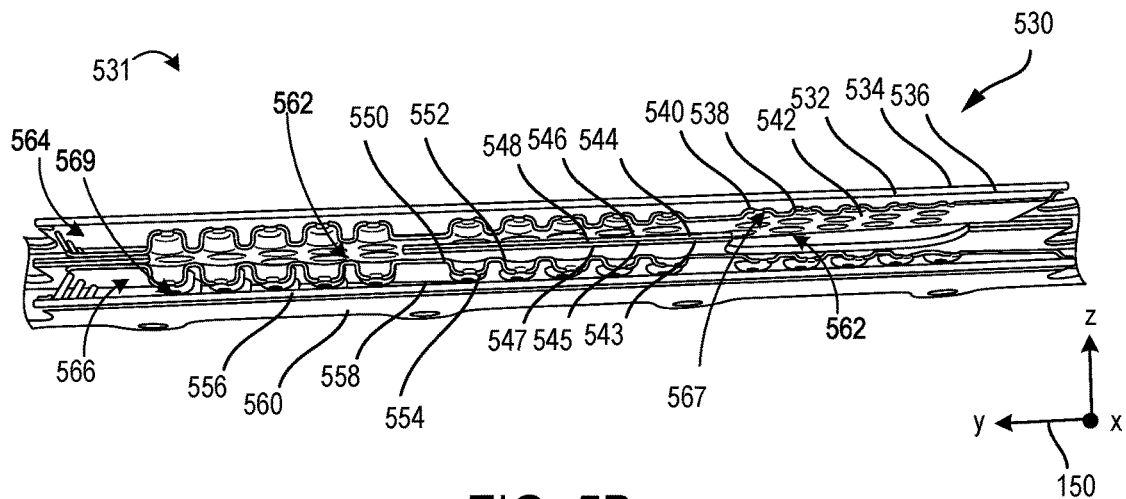
FIG. 5B shows a section of a third embodiment for a heat exchanger assembly, particularly the fluid channel profile.
Figure 6:
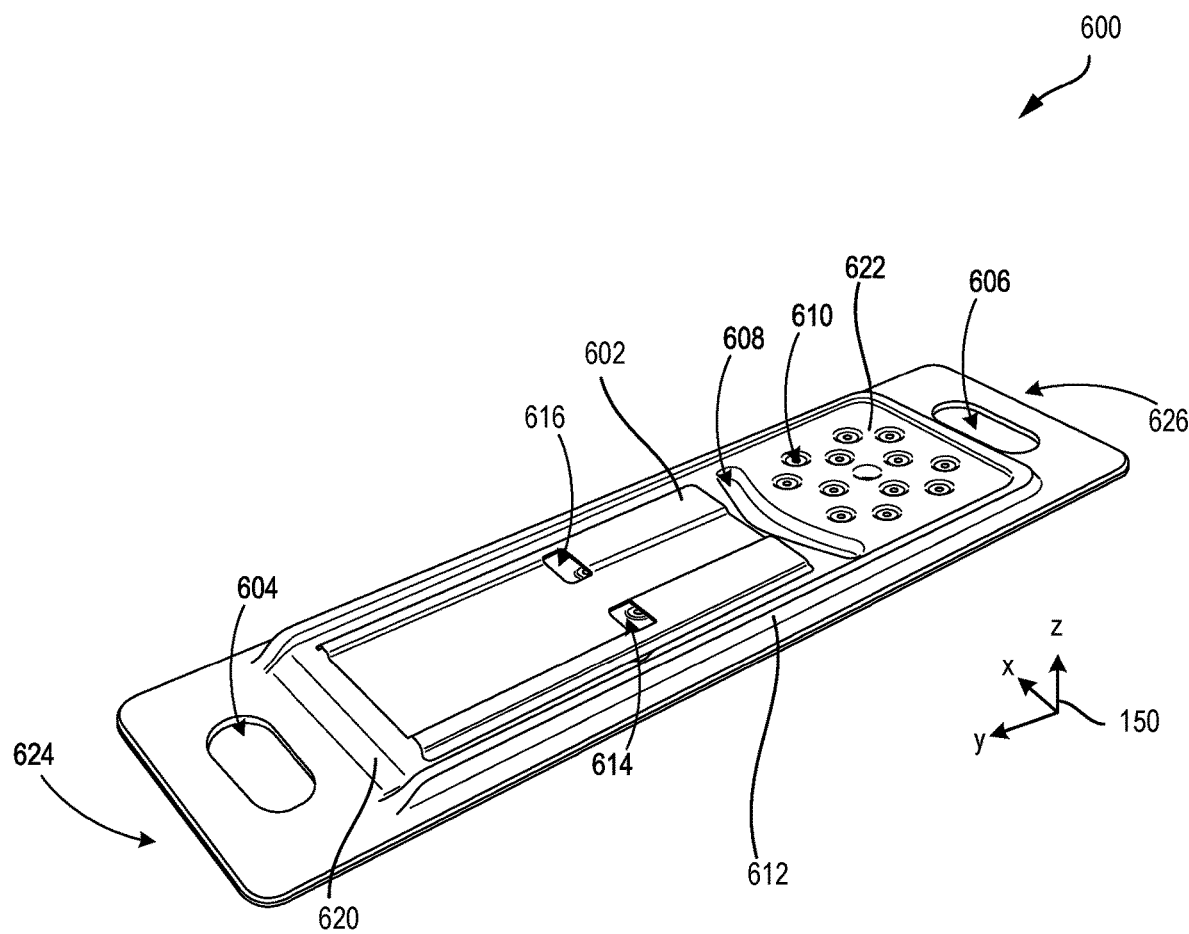
FIG. 6 shows an embodiment of a flow control perforated plate for the heat exchanger assembly.
Figure 7:
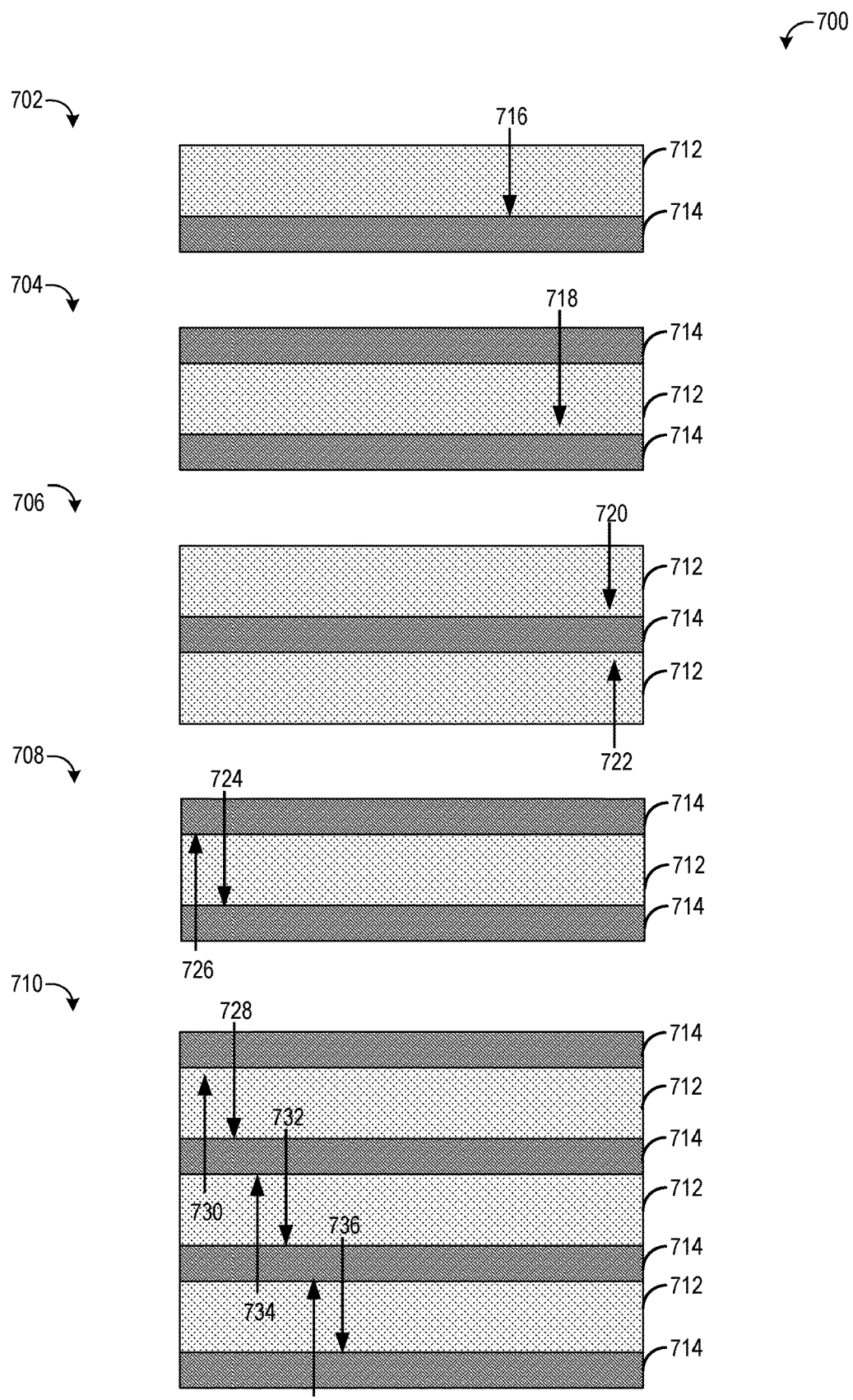
FIG. 7 shows a schematic diagram of various configurations of the heat exchanger assembly.

The following description relates to systems for a heat exchanger assembly including jet impingement. The heat exchanger assembly comprises three plates including an upper plate, a perforated plate, and a bottom plate. Fluid such as coolant may enter the heat exchanger assembly through a fluid inlet and pass through the perforated plate as jet streams (e.g., impingement jets). The jet streams transfer heat from electronic chips coupled to the base plate to then exit through a fluid outlet. The jet impingement design reduces pressure drop and increases heat transfer capacity relative to heat exchange assembly examples including turbulizers with an additional advantage of highly customizable configurations. A top view of an embodiment of the heat exchanger assembly is shown in FIG. 1A. A bottom view of an embodiment of the heat exchanger assembly is shown in FIG. 1B. A cross section through the fluid inlet of the heat exchanger assembly is shown in FIG. 2 illustrating an embodiment of the top plate, the perforated plate, and the bottom plate. Heat transfer and pressure drop may be tuned based on characteristics of the impingement jets including size, diameter, geometry, and placement in the perforated plate. An embodiment of the perforated plate including a top view and a bottom view is shown in FIGS. 3A and 3B, respectively. The perforated plate may be inclined with respect to the top plate to promote flow characteristics. A section illustrating a configuration of the perforated plate relative to the top plate and bottom plate is shown in FIG. 4. Additional or alternative embodiments of heat exchanger assembly configuration, channel profile, and electronic module placement are variously shown in FIG. 5A, 5B, and 5C. An embodiment of a heat exchanger assembly including a flow control plate is shown in FIG. 6. A schematic illustrating various embodiments of electronic module and heat exchanger configurations is shown in FIG. 7.

In the illustrated example FIGS. 1A and 1B, a heat exchanger assembly 100 is shown. Turning first to FIG. 1A, the example shows a top view of heat exchanger assembly 100 depicting a shape of the device that may be described as generally rectangular and substantially flat. In one example, the height of heat exchanger assembly 100 may be less than a lateral width and the lateral width less than a longitudinal length. An axis system 150 is given in FIG. 1A and is given in each of the figures hereafter. Heat exchanger assembly 100 may include a top plate and a bottom plate. The top view in FIG. 1A shows an embodiment of the top plate, herein referred to as top plate 102, and an embodiment of the bottom plate, herein referred to as base plate 103. In the example, top plate 102 may couple to base plate 103 to capture a perforated plate (see 202 in FIG. 2).

Top plate 102 includes fluid inlet 104 and fluid outlet 106. As one example, tubing, piping, etc. may deliver coolant from a pump to heat exchanger assembly 100. The tubing may couple to fluid inlet 104 via recess 108, for example using fittings or couplers, and tubing may couple to fluid outlet 106 similarly. Coolant may enter fluid inlet 104 and pressurizingly pass through the perforated plate to exchange heat with electronic modules (see 160 in FIG. 1B) affixed to a lower exterior surface (see 152 in FIG. 1B) of base plate 103. After the coolant passes the electronic modules, the coolant exits via fluid outlet 106.

The general shape of exterior surface 114 of top plate 102 comprises a continuous, molded, stair-like surface that may be described as a plurality of landings and risers. Top plate 102 includes first landing 118 that steps down to second landing 122 via first riser 120. Second landing 122 steps down to third landing 126 via second riser 124. Third landing 126 steps down to base plate 103 via third riser 128. Third riser 128 meets with base plate 103 along a perimeter surface 129. Base plate 103 may be substantially flat and occupy a plane parallel to the xy plane, as shown in axis system 150. Second landing 122 and third landing 126 are parallel to base plate 103. Near inlet end 116 of heat exchanger assembly 100, second landing 122 is parallel, or nearly parallel, with base plate 103. First landing 118 inclines longitudinally downward toward outlet end 117.

A plurality of threaded port covers 130 may be molded into the shape of top plate 102. Top plate 102 and threaded port covers 130, may be metal formed or plastic molded. In the example, four threaded port covers 130 are arranged along a longitudinal midline 132 of heat exchanger assembly 100. Threaded port covers 130 may have a hollow, generally half-spherical shape. Threaded port covers 130 provide space for threaded ports (see 156 in FIG. 1B, 202 in FIG. 2) that may be located underneath and may be part of a separate component. The threaded ports allow for fastening of electronic components onto the underside of the base plate.

Base plate 103 features a plurality of regions 112 used to facilitate mounting of heat exchanger assembly 100 to an object. Each region 112 of the plurality of regions 112 may include a through-hole 110 defined by cylindrical surface 138, an opening on region upper face 134 and an opening on a region lower face (154 in FIG. 1B). Heat exchanger assembly 100 may couple to an object using a plurality of fasteners (e.g., bolts, screws, clamps, etc.) inserted through the plurality of through-holes 110.

The base plate 103 couples with the top plate 102 to enclose the perforated plate. Plane 140 indicates a latitudinal plane cross section of heat exchanger assembly 100 through fluid inlet 104. The cross section is shown in FIG. 2 to illustrate the arrangement of top plate 102, base plate 103, and perforated plate 202. Plane 142 indicates a longitudinal cross section of heat exchanger assembly 100 through second landing 122. The cross section is shown in FIG. 4, FIG. 5A, and FIG. 5B to illustrate a various embodiments of perforated plate configurations. Plane 144 indicates a second latitudinal cross section of heat exchanger assembly 100 shown in FIG. 5C to illustrate an additional or alternative embodiment of a perforated plate configuration.

Turning now to FIG. 1B, the example shows a perspective view of heat exchanger assembly 100 depicting a lower exterior surface 152 of base plate 103. The plurality of regions 112 can be seen from the underside including region lower face 154 and through-hole 110 of each region 112. Electronic chips or modules 160 included in a module plate 162 are shown schematically in FIG. 1B. A plurality of modules 160 may be affixed to the lower exterior surface 152 of base plate 103. Modules 160 may be affixed in various ways. As one example, a plurality of threaded ports 156 allow for fastening of electronic components onto the lower exterior surface 152 of base plate 103. Modules 160 may be fastened to base plate 103 using mechanical fasteners (such as screws that make use of threaded ports 156, or compression clips on the edges) or through direct bonding (e.g., soldering, sintering). In an additional or alternative embodiment, the base plate may be removed and a module plate, such as module plate 162, may couple directly to a heat exchanger assembly. Such an embodiment may have advantages such as reduced thermal resistance and overall increased thermal performance.

FIG. 2 shows a cross section 200 of heat exchanger assembly 100 looking down the longitudinal axis from fluid inlet 104. In the example, top plate 102 and base plate 103 enclose perforated plate 202. Perforated plate 202 is positioned between top plate 102 and base plate 103. Perforated plate 202 has upper surface 204 and lower surface 206. In one example, perforated plate is positioned with an underside facing bottom plate such that lower surface 206 of perforated plate 202 faces upper surface 224 of base plate 103. Top plate 102 includes an interior surface 222 and exterior surface 114. Base plate 103 includes upper surface 224, region upper face 134, and lower exterior surface 152. Upper surface 204 of perforated plate 202 faces interior surface 222 of top plate 102. In one embodiment, when coupled in a system, perforated plate 202 may be parallel with base plate 103. Additional or alternative embodiments of heat exchanger assembly 100 may include a perforated plate inclined with respect to a longitudinal or lateral axis (see FIG. 5A, 5B, 5C).

FIG. 2 shows lip 208 in cross section 200 as a wall protruding from upper surface 204. Lip 208 forms a rim along the perimeter of perforated plate 202 and separates regions of the plate into perforated wall 230 and flange 232. Upper surface 204 extends over perforated wall 230 past lip 208 over flange 232. Lower surface 206 of perforated plate 202 is shown including bar 234. Lip 208 and bar 234 of perforated plate 202 are shown in detail in FIG. 3A and FIG. 3B. First threaded port 236 of a plurality of threaded ports (156 in FIG. 1B) is shown with washer 238 and may be used with fasteners, e.g., screws, for fastening electronic components to the lower exterior surface 152 of base plate 103.

Cross section 200 shows interior surface 222 (e.g., the underside) of top plate 102. A series of groove forming walls may protrude from the perimeter of interior surface 222 of top plate 102. In the example, first wall 210, second wall 212, and base 214 form first groove 226. Surfaces of first groove 226 include apex surface 211 of first wall 210, apex surface 213 of second wall 212 and base surface 215 of base 214. Third wall 216, fourth wall 218, and base 220 form second groove 228. Second groove 228 is exterior to first groove 226. Surfaces of second groove 228 include apex surface 217 of third wall 216, apex surface 219 of fourth wall 218 and base surface 221 of base 220. Lip 208 of perforated plate 202 may slot into first groove 226. In one example, second groove 228 may serve as an O-ring groove, e.g., when the top plate is produced from plastic. Cross section 200 shows second landing 122, and third landing 126 of top plate 102 parallel with base plate 103. First landing 118 of top plate 102 is inclined with respect to base plate 103 and perforated plate 202. Walls 210, 212, 216, 218 are perpendicular to base plate 103. First riser 120 and third riser 128 of top plate 102 are perpendicular to base plate 103. Second riser 124 is inclined laterally.

Coolant may enter heat exchanger assembly 100 through fluid inlet 104. The fluid inlet 104 directs fluid into fluid inlet channel 240. From fluid inlet channel 240, coolant pressurizingly passes through a plurality of holes 242 (e.g., perforations) in the perforated wall 230 region of perforated plate 202. Holes 242 are shaped to generate an impingement jet onto the base plate 103. As such, pressurized coolant exits holes 242 as impingement jets spraying the coolant on the upper surface 224 (e.g., hot surface) of base plate 103. Coolant, warmed by electronic modules coupled to lower exterior surface 152 of base plate 103, is directed to side channels 244 to exit heat exchanger assembly 100 via a fluid outlet channel (e.g., 404 in FIG. 4).

Turning now to FIG. 3A, top view 300 of perforated plate 202 is shown. In one example, perforated plate 202 may be joined with top plate 102 and base plate 103 (in FIGS. 1A-2) by brazing. Space 302 provides a recess through which threaded ports (e.g., 156 in FIG. 1B, etc.) may pass through. Top view 300 shows an exemplary arrangement of holes 242 in perforated wall 230. Holes 242 may be defined by inner cylindrical surface 304, an opening on upper surface 204 and an opening on lower surface 206 (see FIG. 3B). The arrangement of holes 242 may be adjusted to suit an application. For example, diameter, pattern, spacing, and distance between impingement jets and bottom plate hot surface may be tuned to increase heat transfer capacity based on location of electronic chips and/or modules on heat exchanger assembly 100. In this way, a jet impingement heat exchanger assembly may be tailored to a specific application.

Perforated plate 202 makes face sharing contact with top plate 102 at surfaces of lip 208 and flange 232. Lip 208 surfaces include interior surface 306, apex surface 308, and exterior surface 310. Flange 232 includes flange surface 312. When positioned between top plate 102 and base plate 103, lip 208 of perforated plate 202 slots into first groove 226 (in FIG. 2) of the top plate. In position within groove 226, apex surface 308 makes face sharing contact with base surface 215 (in FIG. 2) of the groove. Upper surface 204 makes face sharing contact with apex surface 211 (in FIG. 2) of groove 226. Flange surface 312 makes face sharing contact with apex surface 213 (in FIG. 2) of groove 226. Interior surface 306 faces first wall 210 (in FIG. 2) and exterior surface 310 faces second wall 212 (in FIG. 2).

FIG. 3B shows bottom view 350 of perforated plate 202. Bar 234 projects from lower surface 206 of perforated plate 202 near fluid inlet end 352. A plurality of guide ribs, herein referred to as angled ribs 354, project from lower surface 206. Angled ribs 354 may be inclined with respect to both the lateral axis and the longitudinal axis of heat exchanger assembly 100. Angled ribs 354 on the underside of perforated plate 202 may guide coolant flow over each module and direct it to side channels 244 (in FIG. 2). In one example, side channels 244 are formed by edge 360 of angled ribs 354 and third wall 216 (in FIG. 2) of the assembly. A plurality of protrusions 358 project from lower surface 206 near fluid outlet end 356. Angled ribs 354, bar 234, and protrusions 358 may provide structural support and assist in defining the height of the fluid channel. Coupled in the system of heat exchanger assembly 100, coolant passes through lower surface 206 openings of the plurality of holes 242 as impingement jet streams and hits the hot, upper surface 224 (in FIG. 2) of base plate 103. Coolant channels over the upper surface 224, exchanging heat with electronic chips or modules coupled to the lower exterior surface 152 (in FIG. 1B). Coolant flow may be aided by bar 234 and angled ribs 354 reducing pressure drop and increasing overall heat exchange performance of the assembly.

FIG. 4 shows fluid channel profile 400 for heat exchanger assembly 100. FIG. 4 shows a section of the heat exchanger assembly 100 viewed from a perspective looking down the x-axis, indicated in axis system 150. Fluid channel profile 400 illustrates a first embodiment of a fluid channel profile.

Fluid channel profile 400 may include fluid inlet channel 402 and fluid outlet channel 404. FIG. 4 section shows top plate 102 and exterior surface 114, interior surface 222, first groove 226, and second groove 228 thereof. The section also shows perforated plate 202 and lip 208, upper surface 204, lower surface 206, the plurality of holes 242, angled ribs 354 and bar 234 thereof. The section further shows base plate 103 and upper surface 224 and lower exterior surface 152 thereof. Fluid inlet channel 402 may be defined by interior surface 222 and first wall 210 of top plate 102 and upper surface 204 of perforated plate 202. Fluid outlet channel 404 may be defined by lower surface 206 of perforated plate 202, upper surface 224 of base plate 103 and third wall 216 of second groove 228 of top plate 102.

In the example, perforated plate 202 is positioned between top plate 102 and base plate 103. In the first embodiment for heat exchanger assembly 100 including fluid channel profile 400, perforated plate 202 is parallel with base plate 103. Perforated plate 202 and base plate 103 are substantially parallel to the longitudinal axis of the assembly. Top plate 102 includes a portion inclined with respect to the longitudinal axis of the assembly. From fluid inlet end 352, top plate 102 ramps downward (e.g., along the y-axis) towards fluid outlet end 356 such that the profile of the fluid inlet channel 402 is broader near fluid inlet end 352 and narrower near fluid outlet end 356. Coolant passes through holes 242 as impingement jets and into fluid outlet channel 404. Thus, coolant enters fluid inlet 104 an angle relative to perforated plate 202 increasing flow distribution and reducing pressure drop.

FIG. 5A shows a second embodiment of a fluid channel profile 500 for heat exchanger assembly 501. FIG. 5A shows a section of heat exchanger assembly 501 viewed from a perspective looking down the x-axis, indicated in axis system 150.

The section of heat exchanger assembly 501 shows top plate 502 and exterior surface 504 and interior surface 506 thereof. The section of heat exchanger assembly 501 shows perforated plate 508 and upper surface 510 and lower surface 512 thereof. The section further shows base plate 514 including upper surface 516 and lower surface 518. In the embodiment, top plate 502 and base plate 514 are substantially parallel to the longitudinal axis of the assembly.

The section shows fluid inlet channel 520 and fluid outlet channel 522. Fluid inlet channel 520 is captured between interior surface 506 of top plate 502 and upper surface 510 of perforated plate 508. Fluid outlet channel 522 is captured between lower surface 512 of perforated plate 508 and upper surface 516 of base plate 514. The second embodiment including fluid channel profile 500 for heat exchanger assembly 501 includes perforated plate 508 inclined with respect to the longitudinal axis, as indicated by axis system 150 on an angle in the longitudinal direction to increase flow control. Contrasting with perforated plate 202, upper surface 510, and lower surface 512 of perforated plate 508 are essentially flat and without angled ribs (e.g., angled ribs 354 of FIG. 3B). Jet impingement directs coolant via holes 524 to flow over the upper surface 516 exchanging heat with electronic chips and/or modules affixed to the lower surface 518 of base plate 514. In some examples, the perforated plate configured with a longitudinal incline may increase fluid distribution. Substantially parallel top and bottom plates may facilitate stacking configurations of two or more heat exchangers (e.g., see FIG. 7).

FIG. 5B shows heat exchanger assembly 531 including a third embodiment of fluid channel profile 530. Fluid channel profile 530 may be achieved by configuring heat exchanger assembly 531 with a pair of mirror oriented perforated plates. FIG. 5B shows a section of heat exchanger assembly 531 viewed from a perspective looking down the x-axis, indicated in axis system 150.

Fluid channel profile 530 may include jet impingement occurring on an upper plate (e.g., top plate) and lower plate (e.g., bottom plate). In the example, a first perforated plate 538 may produce impingement jets to exchange heat with electronics coupled to the upper plate, herein referred to as first exterior plate 532. A second perforated plate 550 may produce impingement jets to exchange heat with electronics coupled to the lower plate, herein referred to as second exterior plate 556. In the embodiment, the first exterior plate 532 and second exterior plate 556 are substantially parallel to the longitudinal axis. The section of heat exchanger assembly 531 shows first interior plate 544 and upper surface 546 and lower surface 548 thereof. The section includes second interior plate 543 and upper surface 545 and lower surface 547 thereof. First perforated plate 538 may be positioned below first exterior plate 532 and above first interior plate 544. First perforated plate 538 includes first inlet surface 542 and first outlet surface 540. Electronic chips and/or modules may be coupled to first exterior surface 534 of first exterior plate 532. Second perforated plate 550 may be positioned below second interior plate 543 and above second exterior plate 556. Second perforated plate 550 includes second inlet surface 552 and second outlet surface 554. Second exterior plate 556 includes second interior surface 558 and second exterior surface 560. Electronic chips and/or modules may be coupled to second exterior surface 560.

Fluid inlet channel 562 is captured between first inlet surface 542 of first perforated plate 538 and second inlet surface 552 of second perforated plate 550. First interior plate 544 and second interior plate 543 are enclosed within the fluid inlet channel 562. First fluid outlet channel 564 is captured between first interior surface 536 of first exterior plate 532 and first outlet surface 540 of first perforated plate 538. Second fluid outlet channel 566 is captured between second interior surface 558 of second exterior plate 556 and second outlet surface 554 of second perforated plate 550. In one embodiment, first perforated plate 538 and second perforated plate 550 may be inclined with respect to a longitudinal axis of the assembly. Coolant enters fluid inlet channel 562 and passes through a plurality of holes 567 in first perforated plate 538 and a plurality of holes 569 as impingement jets. Impingement jets produced by holes 567 flow coolant into first fluid outlet channel 564. Coolant may flow over first interior surface 536 of first exterior plate 532 and exchange heat modules affixed to first exterior surface 534. Impingement jets produced by holes 569 flow coolant into second fluid outlet channel 566. Coolant flows over second interior surface 558 of second exterior plate 556 and exchange heat modules affixed to the second exterior surface 560 of second exterior plate 556. In this way, heat exchanger assembly including a first and a second perforated plate may be configured in a channel profile with impingement jets of coolant exchanging heat with a first surface and a second surface.

Figure 5C:
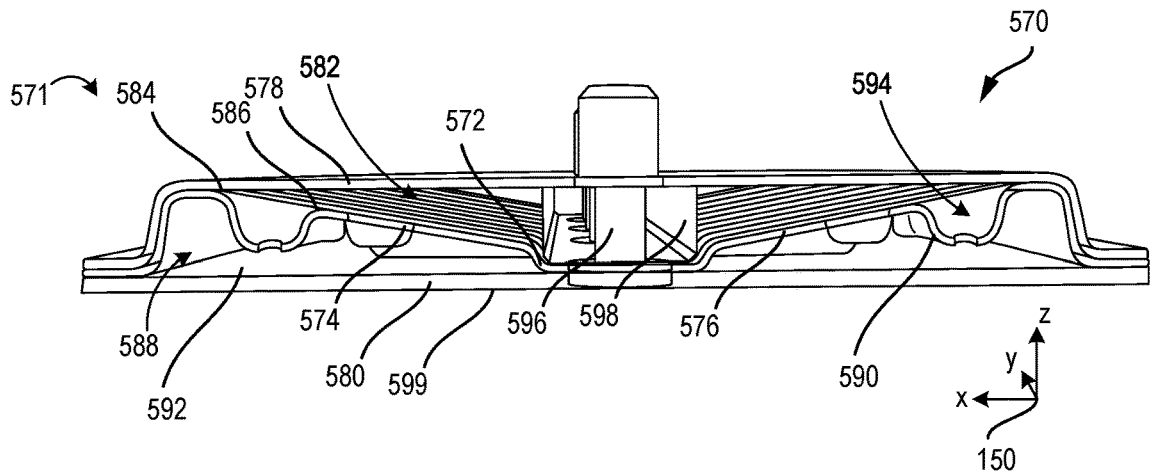
FIG. 5C shows a section of a fourth embodiment for a heat exchanger assembly, particularly the fluid channel profile.

FIG. 5C shows heat exchanger assembly 571 including a fourth embodiment of fluid channel profile 570. FIG. 5C shows a section of heat exchanger assembly 571 viewed from a perspective looking down the y-axis, indicated by axis system 150.

Fluid channel profile 570 may include perforated plate 572 angled in a lateral direction as an additional or alternative means for flow control. In the example, perforated plate 572 includes two portions described herein as a first side 574 and second side 576. First side 574 and second side 576 are symmetrical along the longitudinal axis of heat exchanger assembly 571. Perforated plate 572 may be enclosed within, and sandwiched between, top plate 578 and base plate 580. In the embodiment, top plate 578 and base plate 580 are substantially parallel to the longitudinal axis. A plurality of threaded ports 596 may be partially enclosed in a compartment 598.

Fluid inlet channel 582 is captured between interior surface 584 of top plate 578 and inlet surface 586 of perforated plate 572. Fluid outlet channel 588 is captured between outlet surface 590 perforated plate 572 and interior surface 592 of base plate 580. Coolant passes through a plurality of holes 594 in perforated plate 572 as impingement jets. Impingement jets flow coolant over interior surface 592 to exchange heat with electronic devices coupled to the exterior surface 599 of base plate 580. In this way, a heat exchanger assembly including a perforated plate angled in a lateral direction may provide an additional or alternative configuration for coolant flow control.

Turning now to FIG. 6, an additional or alternative embodiment for a heat exchanger assembly including a flow control perforated plate 600 is shown. As one example, flow control perforated plate 600 is an alternative embodiment for a perforated plate (e.g., perforated plate 202 in FIG. 2, etc.). When coupled in a system, such as heat exchanger assembly 100, flow control perforated plate 600 may be positioned above a base plate and positioned below a top plate (e.g., top plate 102 and base plate 103 in FIG. 1A, etc.).

The shape of flow control perforated plate 600 is generally rectangular. In some embodiments, flow control perforated plate 600 and features thereof may be metal formed or plastic molded. Flow control perforated plate 600 includes a flow control plate, herein referred to as interior flow plate 602. Interior flow plate 602 is coupled to and positioned above flow control perforated plate 600. Flow control perforated plate 600 includes an inlet recess 604 and outlet recess 606. In one example, when coupled in heat exchanger assembly 100, inlet recess 604 may be positioned below fluid inlet 104 and outlet recess 606 may be positioned below fluid outlet 106. Flow control perforated plate 600 includes trough 608 and plurality of holes 610 molded into the shape of the plate. Holes 610 are shaped to generate an impingement jet onto the base plate and may be analogous to holes 242 described in FIG. 2. In one example, the underside of trough 608 forms a guide rib for providing flow control on the outlet side of flow control perforated plate 600 and may be analogous to angled ribs 354 described in FIG. 3B. Lip 612 forms a three-sided rim around an interior portion 622 of flow control perforated plate 600. On side 620 without lip 612, flow control perforated plate 600 inclines along the longitudinal axis. Interior flow plate 602 includes first window 614 and second window 616.

When coupled in a system, coolant enters the assembly and flows over flow control perforated plate 600 over the incline of side 620. Lip 612 collects and directs coolant towards the plurality of holes 610. A position of interior flow plate 602 may be adjusted such that first window 614 and second window 616 may allow an amount (e.g., more or less) and position of coolant flow through the impingement jets formed by the plurality of holes 610 molded in the flow control perforated plate 600. In one example, the position of first window 614 and second window 616, relative to first end 624 and second end 626 of plate 602, may be adjusted based on desired flow parameters. The size of first window 614 and second window 616 may also be adjusted.

FIG. 7 shows a schematic diagram 700 illustrating first configuration 702, second configuration 704, third configuration 706, and fourth configuration 708, and fifth configuration 710 for a heat exchanger assembly. In the example, heat exchanger 712 and electronic chips 714 are shown.

First configuration 702 illustrates an example heat exchanger assembly using one-sided jet impingement. First configuration includes a single heat exchanger 712 with electronic chips 714. In this example, arrow 716 indicates a direction of impingement jets.

Second configuration 704 also illustrates one-sided jet impingement. Second configuration includes heat exchanger 712 with first and second electronic chips 714 positioned above and below the heat exchanger. Arrow 718 indicates an example direction of impingement jets. In such a configuration, low heat transfer devices may be coupled to a side opposite to the direction of impingement jets.

Third configuration 706 illustrates two heat exchangers, each with one-sided jet impingement. Third configuration includes electronic chips 714 with first and second heat exchanger 712 positioned above and below the chips. Arrow 720 and arrow 722 indicate a first and a second direction, respectively, of impingement jets. As an example, in such a configuration, chips may be sandwiched between the heat exchangers for high heat transfer applications.

Fourth configuration 708 illustrates a single heat exchanger including two-sided jet impingement. A similar configuration is described with reference to FIG. 5B. Fourth configuration includes heat exchanger 712 with first and second electronic chips 714 positioned above and below the heat exchanger. Arrow 724 and arrow 726 indicate a first and a second direction of impingement jets. In such a configuration, high heat transfer capacity from bi-directional impingement jets may be utilized for coupling electronic devices to upper and lower surfaces of heat exchanger 712.

Fifth configuration 710 illustrates multiple heat exchangers including two-sided jet impingement. In such a configuration, a plurality of heat exchangers with two-sided jet impingement could be stacked with electronic chips positioned on either side. The example shows an example heat exchange assembly including three heat exchanger 712 and four electronic chips 714. Arrows 728, 730, 732, 734, 736, 738 indicate bi-directional jet impingement for the upper and lower electronic chips 714. In such a configuration, high heat transfer capacity from impingement jets may be utilized on upper and lower surfaces of each heat exchanger 712 of the assembly.

In this way, jet impingement may be utilized to increase heat transfer capacity in a heat exchanger assembly. By angling an inlet of the coolant fluid and flowing coolant over an inclined perforated plate, pressure drops in the system may be reduced and flow distribution increased. The technical effect of a heat exchanger assembly including jet impingement is increased capacity for heat transfer and cooling of power-dense, high-heat producing electronics.

FIGS. 1-6 show example configurations with relative positioning of the various components. If shown directly contacting each other, or directly coupled, then such elements may be referred to as directly contacting or directly coupled, respectively, at least in one example. Similarly, elements shown contiguous or adjacent to one another may be contiguous or adjacent to each other, respectively, at least in one example. As an example, components laying in face-sharing contact with each other may be referred to as in face-sharing contact. As another example, elements positioned apart from each other with only a space therebetween and no other components may be referred to as such, in at least one example. As yet another example, elements shown above/below one another, at opposite sides to one another, or to the left/right of one another may be referred to as such, relative to one another. Further, as shown in the figures, a topmost element or point of element may be referred to as a "top" of the component and a bottommost element or point of the element may be referred to as a "bottom" of the component, in at least one example. As used herein, top/bottom, upper/lower, above/below, may be relative to a vertical axis of the figures and used to describe positioning of elements of the figures relative to one another. As such, elements shown above other elements are positioned vertically above the other elements, in one example. As yet another example, shapes of the elements depicted within the figures may be referred to as having those shapes (e.g., such as being circular, straight, planar, curved, rounded, chamfered, angled, or the like). Further, elements shown intersecting one another may be referred to as intersecting elements or intersecting one another, in at least one example. Further still, an element shown within another element or shown outside of another element may be referred as such, in one example.

It will be appreciated that the configurations and routines disclosed herein are exemplary in nature, and that these specific embodiments are not to be considered in a limiting sense, because numerous variations are possible. Moreover, unless explicitly stated to the contrary, the terms "first," "second," "third," and the like are not intended to denote any order, position, quantity, or importance, but rather are used merely as labels to distinguish one element from another. The subject matter of the present disclosure includes all novel and non-obvious combinations and sub-combinations of the various systems and configurations, and other features, functions, and/or properties disclosed herein.

As used herein, the term "approximately" is construed to mean plus or minus five percent of the range unless otherwise specified, and the term "substantially parallel" means that the elements are sufficiently parallel to be considered parallel to one of ordinary skilled in the art without being perfectly parallel.

The disclosure also provides support for a heat exchanger assembly, comprising: a top plate, a fluid inlet and a fluid outlet, a bottom plate coupled to the top plate, a perforated plate positioned between the top plate and the bottom plate having an underside facing the bottom plate and including perforations shaped to generate an impingement jet onto the bottom plate, and at least one of the following: the top plate comprising a portion being inclined with respect to a longitudinal axis of the heat exchanger assembly, the perforated plate being inclined with respect to the longitudinal axis or a lateral axis of the heat exchanger assembly, and the heat exchanger assembly further comprising a flow control plate. In a first example of the system, the perforated plate comprises guide ribs positioned on a side of the perforated plate, the guide ribs being inclined with respect to both the lateral axis and the longitudinal axis of the heat exchanger assembly. In a second example of the system, optionally including the first example, the top plate comprises a portion being inclined with respect to the longitudinal axis of the heat exchanger assembly and wherein the perforated plate and the bottom plate are substantially parallel to the longitudinal axis of the heat exchanger assembly. In a third example of the system, optionally including one or both of the first and second examples, the heat exchanger assembly further comprises the flow control plate, wherein the flow control plate is positioned above the perforated plate, and wherein the top plate, the bottom plate, and the perforated plate are substantially parallel to the longitudinal axis of the heat exchanger assembly. In a fourth example of the system, optionally including one or more or each of the first through third examples, the perforated plate is substantially flat. In a fifth example of the system, optionally including one or more or each of the first through fourth examples, the perforated plate is inclined with respect to the longitudinal axis of the heat exchanger assembly and wherein the top plate and the bottom plate are substantially parallel to the longitudinal axis of the heat exchanger assembly. In a sixth example of the system, optionally including one or more or each of the first through fifth examples including a second perforated plate, wherein the perforated plates are inclined with respect to the longitudinal axis of the heat exchanger assembly and wherein the top plate and the bottom plate are substantially parallel to the longitudinal axis of the heat exchanger assembly. In a seventh example of the system, optionally including one or more or each of the first through sixth examples, the perforated plate includes two portions being symmetrical along the longitudinal axis of the heat exchanger assembly, each on the two portions being inclined with respect to the lateral axis of the heat exchanger assembly and wherein the top plate and the bottom plate are substantially parallel to the longitudinal axis of the heat exchanger assembly. In an eighth example of the system, optionally including one or more or each of the first through seventh examples, the top plate, bottom plate, and perforated plate are rectangular. In a ninth example of the system, optionally including one or more or each of the first through eighth examples, the system further comprises: an electronic module adjacent a bottom of the bottom plate. In a tenth example of the system, optionally including one or more or each of the first through ninth examples, a height of the heat exchanger assembly is less than a lateral width, the lateral width less than a longitudinal length. In a eleventh example of the system, optionally including one or more or each of the first through tenth examples including a second perforated plate, wherein the perforated plate and the second perforated plate are mirror oriented to generate impingement jets on an upper plate and a lower plate of the heat exchanger assembly, wherein the upper plate and the lower plate are substantially parallel to the longitudinal axis of the heat exchanger assembly.

The disclosure also provides support for a system, comprising: a heat exchanger assembly including a top plate, a fluid inlet and a fluid outlet, a bottom plate coupled to the top plate, a perforated plate positioned between the top plate and the bottom plate having an underside facing the bottom plate and including perforations shaped to generate an impingement jet onto the bottom plate, an electronic module adjacent a bottom of the bottom plate, and at least one of the following: the top plate comprising a portion being inclined with respect to a longitudinal axis of the heat exchanger assembly, the perforated plate being inclined with respect to the longitudinal axis or a lateral axis of the heat exchanger assembly, and the heat exchanger assembly further comprising a flow control plate. In a first example of the system, the perforated plate comprises guide ribs positioned on a side of the perforated plate, the guide ribs being inclined with respect to both the lateral axis and the longitudinal axis of the heat exchanger assembly. In a second example of the system, optionally including the first example, the top plate comprises a portion being inclined with respect to the longitudinal axis of the heat exchanger assembly and wherein the perforated plate and the bottom plate are substantially parallel to the longitudinal axis of the heat exchanger assembly. In a third example of the system, optionally including one or both of the first and second examples, the perforated plate is substantially flat. In a fourth example of the system, optionally including one or more or each of the first through third examples, the perforated plate is inclined with respect to the longitudinal axis of the heat exchanger assembly and wherein the top plate and the bottom plate are substantially parallel to the longitudinal axis of the heat exchanger assembly. In a fifth example of the system, optionally including one or more or each of the first through fourth examples, the heat exchanger assembly further comprises a second perforated plate, wherein the perforated plates are inclined with respect to the longitudinal axis of the heat exchanger assembly, and wherein the top plate and the bottom plate are substantially parallel to the longitudinal axis of the heat exchanger assembly. In a sixth example of the system, optionally including one or more or each of the first through fifth examples, the perforated plate includes two portions being symmetrical along the longitudinal axis of the heat exchanger assembly, each on the two portions being inclined with respect to the lateral axis of the heat exchanger assembly, and wherein the top plate and the bottom plate are substantially parallel to the longitudinal axis of the heat exchanger assembly. In a seventh example of the system, optionally including one or more or each of the first through sixth examples including a second perforated plate, wherein the perforated plate and the second perforated plate are mirror oriented to generate impingement jets on an upper plate and a lower plate of the heat exchanger assembly, wherein the upper plate and the lower plate are substantially parallel to the longitudinal axis of the heat exchanger assembly.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

FIGS. 1A-6 are shown approximately to scale.

The invention claimed is:

1. A heat exchanger assembly, comprising:
a top plate;
a fluid inlet and a fluid outlet;
a bottom plate coupled to the top plate; and
a perforated plate positioned between the top plate and the bottom plate and including perforations shaped to generate an impingement jet onto the bottom plate or the top plate, the perforated plate including a flange and a lip that forms a rim along a perimeter of the perforated plate, wherein the lip divides the perforated plate into the flange and a perforated wall including the perforations,
wherein the perforated plate is inclined with respect to a longitudinal axis or a lateral axis of the heat exchanger assembly.

2. The heat exchanger assembly of claim 1, wherein the lip is configured to slot into a groove of the heat exchanger assembly.

3. The heat exchanger assembly of claim 1, wherein the perforated plate is substantially flat.

4. The heat exchanger assembly of claim 1, wherein the perforated plate is inclined with respect to the longitudinal axis of the heat exchanger assembly, and wherein the top plate and the bottom plate are substantially parallel to the longitudinal axis of the heat exchanger assembly.

5. The heat exchanger assembly of claim 1, wherein the top plate, the bottom plate, and the perforated plate are rectangular.

6. The heat exchanger assembly of claim 1, including a second perforated plate, wherein the perforated plate and the second perforated plate are mirror oriented to generate impingement jets on the top plate and the bottom plate of the heat exchanger assembly, and wherein the top plate and the bottom plate are substantially parallel to the longitudinal axis of the heat exchanger assembly.

7. The heat exchanger assembly of claim 6, wherein the impingement jets on the top plate and the bottom plate of the heat exchanger assembly include a first impingement jet onto the top plate generated by the perforations of the perforated plate and a second impingement jet generated by perforations of the second perforated plate, and wherein the second perforated plate has perforations shaped to generate the second impingement jet onto the bottom plate.

8. The heat exchanger assembly of claim 7, wherein the second perforated plate is inclined such that the second perforated plate is closer to the bottom plate at a first side of the heat exchanger assembly than at a second side of the heat exchanger assembly, and wherein the perforated plate is inclined such that the perforated plate is closer to the top plate at the first side of the heat exchanger assembly than at the second side of the heat exchanger assembly.

9. The heat exchanger assembly of claim 8, further comprising an electronic module adjacent a bottom of the bottom plate and one or more plates positioned between the perforated plate and the second perforated plate.

10. The heat exchanger assembly of claim 9, wherein a height of the heat exchanger assembly is less than a lateral width of the heat exchanger assembly, the lateral width less than a longitudinal length of the heat exchanger assembly, and wherein the perforated plate and the second perforated plate are vertically stacked such that the second perforated plate is positioned intermediate the bottom plate and the one or more plates, and the perforated plate is positioned intermediate the one or more plates and the top plate.

11. A heat exchanger assembly, comprising:
a top plate;
a fluid inlet and a fluid outlet;
a bottom plate coupled to the top plate;
a first perforated plate positioned between the top plate and the bottom plate and including perforations shaped to generate an impingement jet onto the bottom plate or the top plate, the first perforated plate including a lip that forms a rim along a complete perimeter of the perforated plate;
a second perforated plate, wherein the first perforated plate and the second perforated plate are inclined with respect to a longitudinal axis of the heat exchanger assembly, and wherein the top plate and the bottom plate are substantially parallel to the longitudinal axis of the heat exchanger assembly.

12. A system, comprising:
a heat exchanger assembly including a top plate, a fluid inlet and a fluid outlet, a bottom plate coupled to the top plate, a first perforated plate and a second perforated plate positioned between the top plate and the bottom plate, the first perforated plate having a topside facing the top plate and including perforations shaped to generate an impingement jet onto the top plate, and the second perforated plate having an underside facing the bottom plate and including perforations shaped to generate an impingement jet onto the bottom plate, wherein the first perforated plate includes a lip that forms a rim along a complete perimeter of the first perforated plate, and an electronic module adjacent a bottom of the bottom plate, wherein the first perforated plate and the second perforated plate are each inclined with respect to a longitudinal axis of the heat exchanger assembly and each other.

13. The system of claim 12, further comprising one or more plates positioned intermediate the first perforated plate and the second perforated plate, wherein the first perforated plate and the second perforated plate are vertically stacked such that the second perforated plate is positioned intermediate the bottom plate and the one or more plates, and the first perforated plate is positioned intermediate the one or more plates and the top plate.

14. The system of claim 13, wherein the second perforated plate is inclined such that the second perforated plate is closer to the bottom plate at a first side of the heat exchanger assembly than at a second side of the heat exchanger assembly, and wherein the first perforated plate is inclined such that the first perforated plate is closer to the top plate at the first side of the heat exchanger assembly than at the second side of the heat exchanger assembly.

15. The system of claim 12, wherein the perforated plate is substantially flat.

16. The system of claim 12, wherein the top plate and the bottom plate are substantially parallel to the longitudinal axis of the heat exchanger assembly.

17. The system of claim 12, further comprising a fluid inlet channel captured between a first inlet surface of first perforated plate and a second inlet surface of the second perforated plate, a first fluid outlet channel captured between a first interior surface of the top plate and a first outlet surface of the first perforated plate, and a second fluid outlet channel captured between a second interior surface of the bottom plate and a second outlet surface of the second perforated plate.

18. The system of claim 12, wherein the fluid inlet and the fluid outlet are part of the top plate.

19. The system of claim 12, wherein the first perforated plate and the second perforated plate are mirror oriented to generate the impingement jet onto the top plate and the impingement jet onto the bottom plate.

* * * * *